US009754911B2

(12) United States Patent
West et al.

(10) Patent No.: US 9,754,911 B2
(45) Date of Patent: Sep. 5, 2017

(54) IC STRUCTURE WITH ANGLED INTERCONNECT ELEMENTS

(71) Applicant: GLOBALFOUNDRIES Inc., Grand Cayman (KY)

(72) Inventors: David J. West, Essex Junction, VT (US); Charles H. Wilson, Essex Junction, VT (US); Richard S. Graf, Gray, ME (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 14 days.

(21) Appl. No.: 14/875,032

(22) Filed: Oct. 5, 2015

(65) Prior Publication Data

US 2017/0098623 A1    Apr. 6, 2017

(51) Int. Cl.
*H01L 23/48* (2006.01)
*H01L 23/52* (2006.01)
(Continued)

(52) U.S. Cl.
CPC .......... *H01L 24/17* (2013.01); *H01L 21/4853* (2013.01); *H01L 21/76885* (2013.01);
(Continued)

(58) Field of Classification Search
CPC ..... H01L 21/76885; H01L 2224/40477; H01L 2224/48477; H01L 2224/72; H01L 2224/90; H01L 2225/1058; H01L 24/72; H01L 24/90; H01L 35/06; H01L 41/0536; H01L 2021/60002; H01L 2225/06513; H01L 2924/18161; H01L 21/563; H01L 2224/1134; H01L 2224/85051; H01L 2224/16108; H01L 2224/1616; H01L 2224/1623; H01L 2224/16113;
(Continued)

(56) References Cited

U.S. PATENT DOCUMENTS 6,229,220 B1    5/2001   Saitoh et al.
6,255,727 B1 *  7/2001   Khoury .................... G01R 3/00
                                                 257/48

(Continued)

OTHER PUBLICATIONS

Aggarwal et al., "Design and fabrication of high aspect ratio fine pitch interconnects for wafer level packaging", Proc. IEEE 4th Electronics Packaging Technology Conference, pp. 229-234 (2002).

(Continued)

*Primary Examiner* — Teresa M Arroyo
(74) *Attorney, Agent, or Firm* — Anthony Canale; Hoffman Warnick LLC

(57) ABSTRACT

Aspects of the present disclosure include integrated circuit (IC) structures with angled interconnect elements. An IC structure according to the present disclosure can include: an IC chip interconnect surface including a radially inner region positioned within a radially outer region; and a plurality of conductive pillars extending outward from the radially inner region of the IC chip interconnect surface, relative to a radial centerline axis of the radially inner region of the IC chip interconnect surface, wherein the radially inner region of the IC chip interconnect surface is free of conductive pillars thereon.

14 Claims, 5 Drawing Sheets

(51) Int. Cl.
*H01L 29/40* (2006.01)
*H01L 23/00* (2006.01)
*H01L 21/768* (2006.01)
*H01L 21/48* (2006.01)
*H01L 21/60* (2006.01)

(52) U.S. Cl.
CPC .............. *H01L 24/15* (2013.01); *H01L 24/90* (2013.01); *H01L 2021/60022* (2013.01); *H01L 2224/13027* (2013.01); *H01L 2224/15* (2013.01); *H01L 2224/16113* (2013.01); *H01L 2224/16168* (2013.01); *H01L 2224/1712* (2013.01); *H01L 2224/81192* (2013.01); *H01L 2224/90* (2013.01)

(58) Field of Classification Search
CPC . H01L 2224/16105; H01L 2224/16148; H01L 2224/16168; H01L 2224/16188; H01L 2224/16198; H01L 2224/16238; H01L 2224/16258; H01L 2224/16268; H01L 2224/48475; H01L 2224/15; H01L 2224/13027; H01L 2224/48471; H01L 2224/81192; H01L 2224/1712; H01L 23/4952; H01L 2021/60247; H01L 24/15; H01L 24/17; H01L 21/4853; H01L 21/4825; H01L 21/6875; H01L 22/12; H01L 22/30; G01B 11/272; G01B 2210/56; G03F 7/0002; G03F 7/70141; G03F 7/70625
USPC .......................................... 257/737, 778, 780
See application file for complete search history.

(56) References Cited

U.S. PATENT DOCUMENTS

| | | | |
|---|---|---|---|
| 6,339,534 B1 | 1/2002 | Coico et al. | |
| 6,528,349 B1* | 3/2003 | Patel | H01L 23/3114 |
| | | | 257/E21.508 |
| 6,578,754 B1 | 6/2003 | Tung | |
| 6,657,124 B2* | 12/2003 | Ho | H01L 23/49816 |
| | | | 174/521 |
| 7,132,736 B2 | 11/2006 | Bakir et al. | |
| 7,208,834 B2 | 4/2007 | Lee et al. | |
| 7,276,801 B2 | 10/2007 | Dubin et al. | |
| 7,476,982 B2* | 1/2009 | Autumn | H01L 24/11 |
| | | | 257/734 |
| 7,989,945 B2* | 8/2011 | Williams | H01L 24/72 |
| | | | 257/692 |
| 8,334,594 B2 | 12/2012 | Lo et al. | |
| 2002/0056922 A1* | 5/2002 | Funaya | H01L 23/49811 |
| | | | 257/778 |
| 2005/0040540 A1* | 2/2005 | Haba | H01L 24/11 |
| | | | 257/778 |
| 2010/0314734 A1* | 12/2010 | Sheats | H01L 23/5389 |
| | | | 257/685 |
| 2010/0314745 A1* | 12/2010 | Masumoto | H01L 23/49811 |
| | | | 257/692 |
| 2013/0020711 A1 | 1/2013 | Bao et al. | |
| 2013/0105993 A1 | 5/2013 | Bahadur et al. | |
| 2014/0231266 A1 | 8/2014 | Sherrer et al. | |
| 2014/0239492 A1* | 8/2014 | Fujii | H01L 23/49811 |
| | | | 257/737 |
| 2014/0264890 A1 | 9/2014 | Breuer et al. | |

OTHER PUBLICATIONS

Dang et al., "Optimal implementation of sea of leads (SoL) compliant interconnect technology", Proc. 2004 IEEE International Interconnect Technology Conference, pp. 99-101 (2004).

Koh et al., "Copper Pillar Bump Technology Progress Overview", Proc. 2011 IEEE International Conference on Electronic Packaging Technology & High Density Packaging, pp. 1133-1136 (2011).

Zhu et al., "Beta-Helix: A Lithography-Based Compliant Off-Chip Interconnect", IEEE Transactions on Components and Packaging Technologies, vol. 26, No. 3, pp. 582-590 (2003).

Ko et al., "All-inkjet-printed flexible electronics fabrication on a polymer substrate by low-temperature high-resolution selective laser sintering of metal nanoparticles", Nanotechnology 18 (2007) paper# 345202 (8pp).

Maekawa et al., "Drop-on-demand laser sintering with silver nanoparticles for electronics packaging", IEEE Transactions on Components, Packaging and Manufacturing Technology, 2(5), pp. 868-877 (2012).

* cited by examiner

IC STRUCTURE WITH ANGLED INTERCONNECT ELEMENTS

FIELD OF THE INVENTION

The subject matter disclosed herein relates to integrated circuit (IC) structures for electrically connecting IC chips to packaging. More specifically, aspects of the invention relate to IC structures with one or more angled interconnect elements.

BACKGROUND

In flip chip processing of semiconductor integrated circuit (IC) chips, interconnect structures such as solder bumps are used to connect IC dies to packaging. However, due to the coefficient of thermal expansion (CTE) differences between the IC die and the packaging, solder bumps can experience large stresses at interconnect joints positioned therebetween and thereby cause a risk of crack formation during the joining of a chip. In addition, CTE mismatch can cause strains on the material during cooldown and solder solidification processes. A mismatch between CTEs may be especially prevalent, e.g., where interconnects include solder, copper pillars, and/or similar materials which join a silicon chip to a substrate such as a circuit board or other element composed of ceramic, leadframe, and/or other materials. Corrective designs for mitigating these risks may be insufficient because substrate and laminate materials must also match with a particular map of interconnects at room temperature, even though these elements are joined together under higher temperature conditions.

BRIEF SUMMARY

A first embodiment of the present disclosure provides an IC structure including: an IC chip interconnect surface including a radially inner region positioned within a radially outer region; and a plurality of conductive pillars extending outward from the radially inner region of the IC chip interconnect surface, relative to a radial centerline axis of the radially inner region of the IC chip interconnect surface, wherein the radially inner region of the IC chip interconnect surface is free of conductive pillars thereon.

A second embodiment of the present disclosure provides an integrated circuit (IC) structure including: an IC chip having an interconnect surface thereon; a first plurality of conductive pillars extending substantially perpendicularly from the interconnect surface of the IC chip, and a second plurality of conductive pillars extending substantially non-perpendicularly from the interconnect surface of the IC chip, wherein each of the second plurality of conductive pillars is positioned radially outward from the first plurality of conductive pillars, relative to a radial centerline axis of the IC chip.

A third embodiment of the present disclosure provides an IC structure including: an IC chip having an interconnect surface thereon; a first plurality of conductive springs extending substantially perpendicularly from the interconnect surface of the IC chip, and a second plurality of conductive springs extending substantially non-perpendicularly from the interconnect surface of the IC chip, wherein each of the second plurality of conductive springs is positioned radially outward from the first plurality of conductive springs, relative to a radial centerline axis of the IC chip.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Embodiments of the present disclosure provide integrated circuit (IC) structures with angled interconnect elements. To provide relief from package strain after manufacture, embodiments of the present disclosure can include interconnect elements in the form of conductive pillars and/or metal springs extending from a surface of an IC chip. A radial interior of the IC chip can include a first plurality of interconnect elements extending substantially perpendicularly from the surface of the IC chip. Structures according to the present disclosure can also include a second plurality of interconnect elements extending substantially non-perpendicularly from the surface of the IC chip, i.e., oriented to face away from a radial centerline axis thereof. The first plurality of interconnect elements, optionally, can be omitted such that the second plurality of interconnect elements is positioned about an area without interconnect elements connected thereto.

Figure 1:
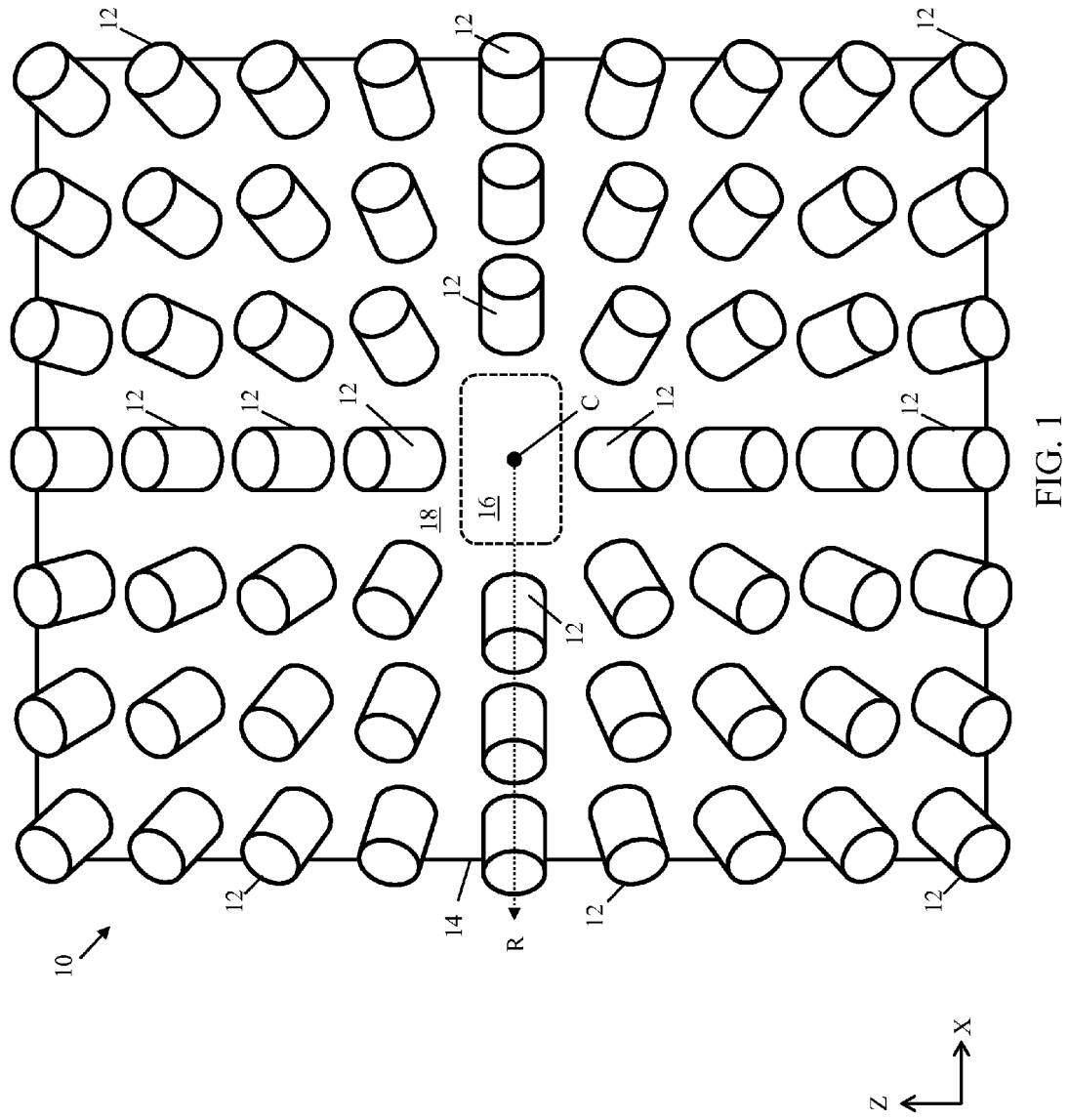
FIG. 1 shows a plan view in plane X-Z of an IC structure according to embodiments of the present disclosure.

Referring to FIG. 1, an IC structure 10 according to embodiments of the present disclosure is shown. Structure 10 can include a first plurality of conductive pillars 12, each extending from IC chip 14 in structure 10. Each conductive pillar 12, and other conductive pillars described herein, can be composed of, e.g., a sintered or sinterable metal such as copper (Cu), molybdenum (Mo), tungsten (W), and/or other metals capable of being formed by sintering. As is discussed elsewhere herein, conductive pillars 12 and/or other conductive pillars and elements described herein can be formed using a laser sintering process. In IC structure 10, a surface of IC chip 14 can include a radially inner region 16 enclosed by a radially outer region 18. Radially inner region 16 can include a radial centerline axis C extending substantially perpendicularly from the surface of IC chip 14 (i.e., out of the plane of the page), with a radial direction R shown extending outward from radial centerline axis C. Furthermore, radially inner region 16 can be free of conductive pillars and/or other connects therein, such that the surface area of IC chip 14 within radially inner region 16 includes no direct electrical connection to other components, e.g., packaging. Each conductive pillar 12 can be oriented radially outward from radially inner region 16 and radial centerline axis C, thereby having a substantially non-perpendicular orientation with respect to radial centerline axis C. As used herein, the term "substantial" or "substantially" in relation to a specified spatial relationship, quantifiable in terms of units such as distance, displacement, conductivity, etc., can include two or more values within ten percentage points (i.e., above or below) of each other and/or a specified numerical value or percentage, and/or all variances in placement which cause no substantial operational difference between the stated spatial relationship (e.g., vertical or horizontal alignment, parallel or perpendicular orientation) and the practiced spatial relationship. The terms "substantial" or "substantially" can also include other specific types of spatial relationships or ranges of spatial relationships where specified herein. Each conductive pillar 12 can be composed of, e.g., a sintered metal or other sinterable material, and can be fabricated according to an example laser sintering process discussed herein, variants thereof, and/or other currently known or later developed process of fabricated an angled, conductive structure.

Figure 2:
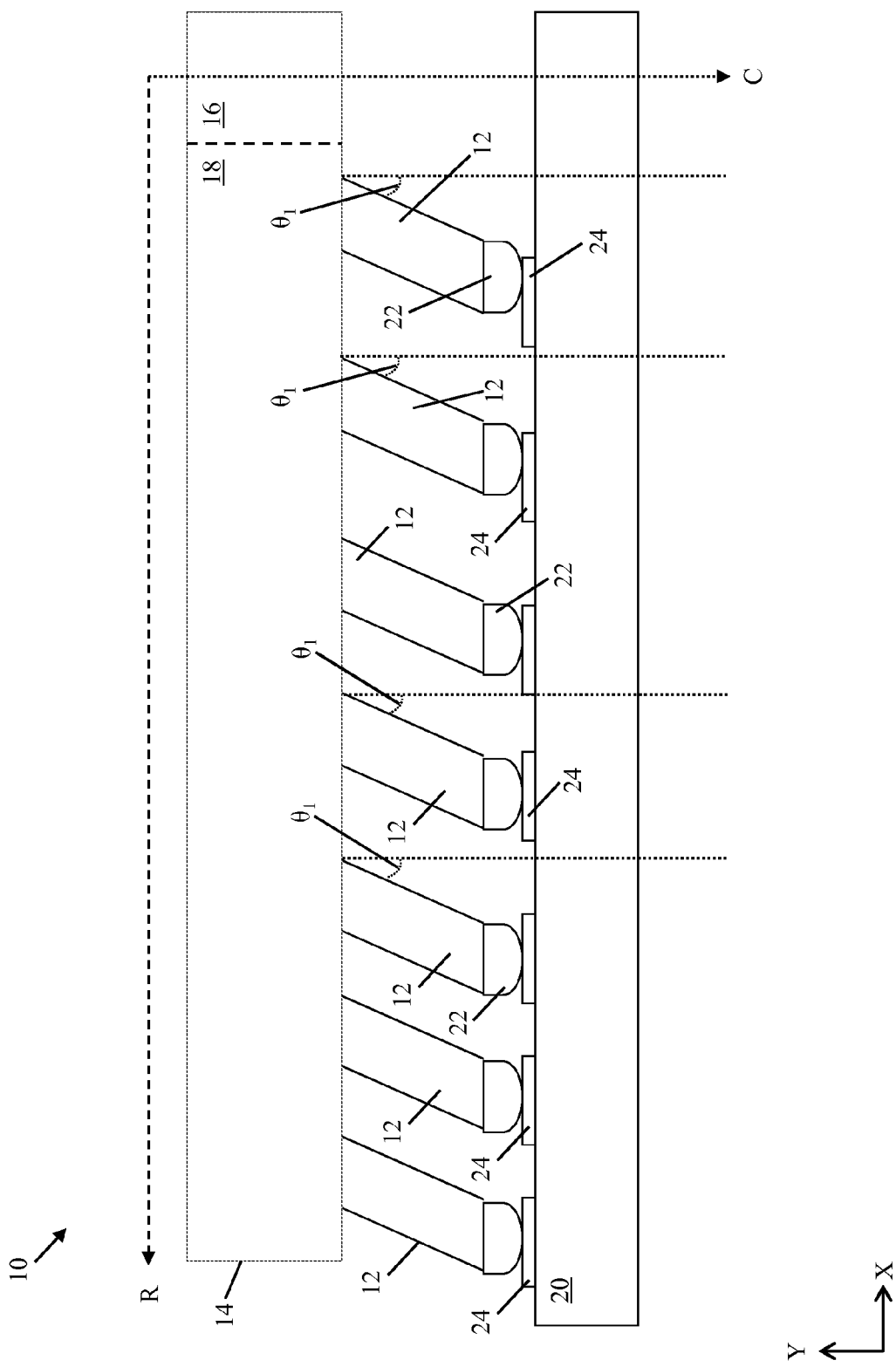
FIG. 2 shows a cross-sectional view in plane X-Y of an IC structure according to embodiments of the present disclosure.

Turning to FIG. 2, a partial cross-sectional side view of IC structure 10 in plane X-Y is shown. More specifically, the view of FIG. 2 illustrates portions of radially inner region 16 and radially outer region 18 relative to radial centerline axis C, shown as extending substantially in parallel with axis Y. Similar to embodiments of structure 10 described elsewhere herein, each conductive pillar 12 can be electrically connected to a substrate 20 through solder bumps 22 positioned on solder bump pads 24. substrate 20 composed of, e.g., any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 20 or a portion thereof may be strained. In any event, substrate 20 can represent all or part of a printed circuit board (PCB) component or laminate. Substrate 20, during operation, can serve as packaging for an IC chip 14 vertically displaced from substrate 20. Each solder bump 22 can be formed in contact with a longitudinally distal end of each conductive pillar 12, relative to radially outer region 18 of IC chip 14. As is also shown in FIG. 2, each conductive pillar 12 can have substantially the same angular orientation ($\theta_1$), i.e., a constant angle, relative to axis Y, thereby being oriented radially outward from radial centerline axis C. However, it is also understood that additional groups of conductive pillars with different angular orientations can also be used within and/or with IC structure 10.

Substrate 20 can be machined to provide a substantially planar upper surface, e.g., by various material removal or polishing techniques now known or later developed, such as CMP or other forms of polishing. As used herein, "CMP" or "chemical-mechanical polishing" refers to a method of removing layers of solid material by chemical-mechanical polishing carried out for the purpose of surface planarization, as is done in back-end of line (BEOL) IC manufacturing. In addition, "RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface. Solder bump pads 24 can be distributed uniformly or non-uniformly across substrate 20 to provide an electrical connection to other elements (not shown) positioned within substrate 20, e.g., metal level wires, through-silicon vias (TSVs), etc. Solder bump pads 24 can be composed of metal or other conductive materials, and can be formed by the use of any currently known or later developed process of forming a material, e.g., deposition, in conjunction with patterning (i.e., forming a mask, depositing a material, etching away portions of the formed material, and removing the mask to yield solder bump pads 24). Deposition as used herein can include any now known or later developed techniques appropriate for the material to be deposited including but are not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, or evaporation.

Structure 10 can include solder bumps 22 positioned over solder bump pads 24, thereby providing an electrical connection between substrate 20 and the plurality of conductive pillars 12. Each solder bump 22 can be composed of any currently known or later developed solderable material that can include, without limitation, material having tin and lead, tin without lead, tin with a residual of copper or silver, tin bismuth, tin indium, etc. In addition, solder bumps 22 can be provided in the form of controlled collapse chip connect (C4) solder bump balls, and/or any other currently known or later developed structure for electrically connecting conductive pillars 12 to solder bump pads 24. In any event, each solder bump 22 can contact conductive pillar(s) 12 at a distal end relative to the surface of IC chip 14.

Each conductive pillar 12 can be fabricated and joined to IC chip 14, e.g., by way of a selective laser sintering process. As such, one or more conductive pillars 12 can be partially or completely formed from a laser-sintered or metal, e.g., one or more of the laser-sinterable materials described elsewhere herein. For the purposes of example and demonstration, an example laser sintering process of forming conductive pillars 12 is provided. A precursor structure to IC chip 14, provided in the form of a wafer, can first be placed in an inert atmosphere. A layer of material, e.g., a metal powder, can then be coated on the surface of the wafer. A laser can selectively sinter the coated powder, thereby causing particular portions of the powder to solidify as a sintered metal structure. Another layer of powder can then be deposited onto the originally coated powder and sintered metal, after which the laser-sintering process can repeat to further sinter portions of the additional powder layer. The process can repeat successively until the sintered metal portions reach a desired size, at which point the powder can be removed from the surface of the wafer. The wafer can then be diced to form individual IC chips 14. To form conductive pillars 12 with predetermined angular profiles, the portions of powder subject to laser sintering can change with each successive layer of powder.

Figure 3:
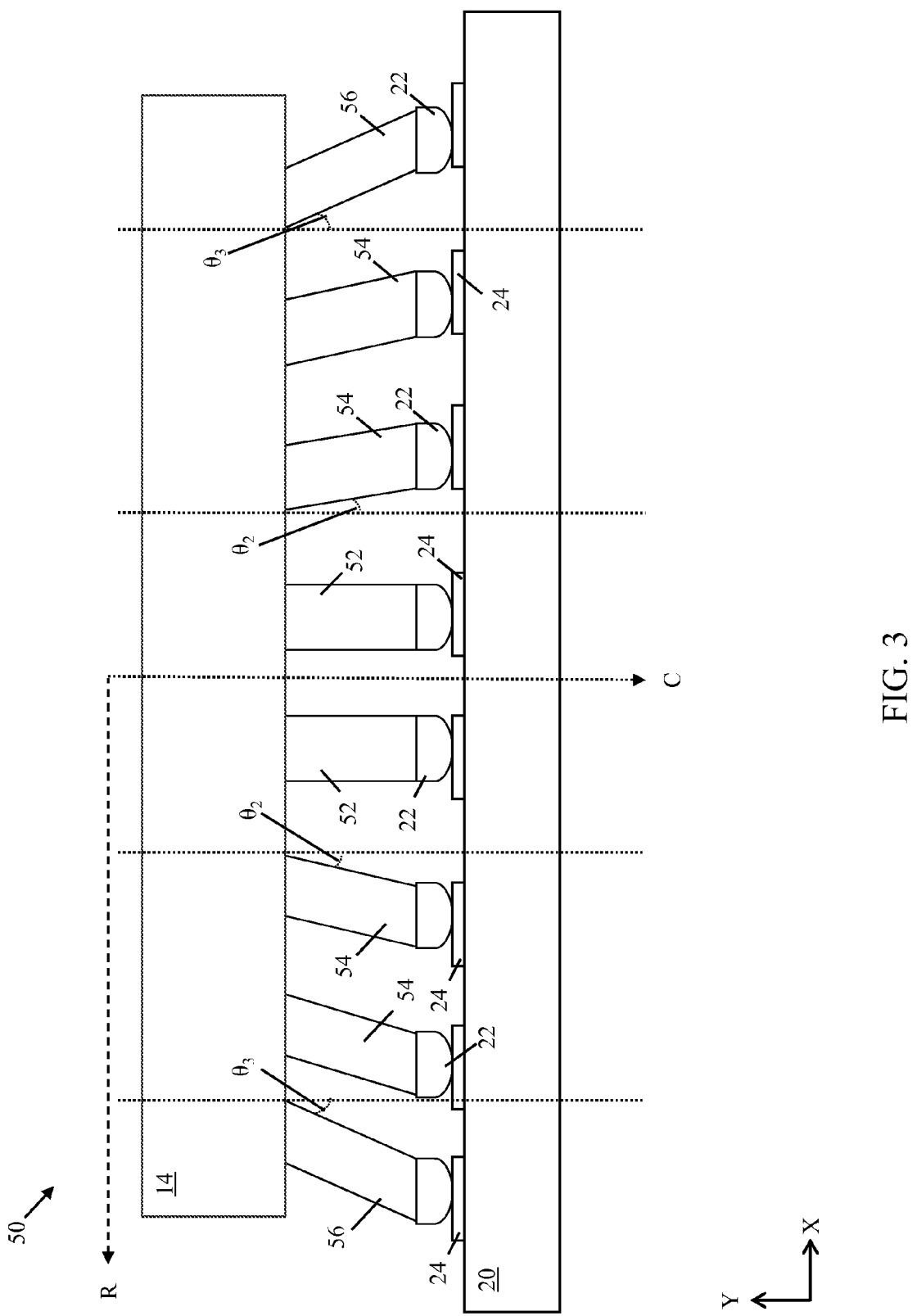
FIG. 3 shows a partial cross-sectional view in plane X-Y of another IC structure according to embodiments of the present disclosure.

Turning to FIG. 3, another configuration of angled interconnect structures according to embodiments of the present disclosure is shown. Here, IC structure 50 can be provided, e.g., by connecting substrate 20 to IC chip 14, and can be formed on IC 14 as an addition or alternative to IC structure 10 (FIG. 1) discussed elsewhere herein. In IC structure 50, IC chip 14 can be free of distinctions between radially outer and inner regions 16, 18 (FIGS. 1, 2). In addition, IC structure 50 can include a first plurality of conductive pillars 52 and a second plurality of conductive pillars 54. First plurality of conductive pillars 52 can each be oriented to extend substantially perpendicularly from a planar surface of IC chip 14, such that each of the first plurality of conductive pillars 52 is directly aligned with a corresponding solder bump 22 and solder bump pad 24 of substrate 20. IC structure 50 can also include a second plurality of conductive pillars 54 extending substantially non-perpendicularly from the surface of IC chip 14. Each of the second plurality of conductive pillars can be oriented to have an angular displacement relative to conductive pillar(s) 52 illustrated by angle $\theta_2$. Second plurality of conductive pillars 20 can each have approximately the same angular displacement ($\theta_1$) relative to the Y axis and/or radial centerline axis C of IC chip 14. As is also shown in FIG. 3, each conductive pillar 54 in the second plurality can be positioned radially outward from each conductive pillar 52 in the first plurality, and oriented radially outward relative to a radial centerline axis C of IC chip 14.

Structure 50 can optionally include a third plurality of conductive pillars 56, each extending substantially non-perpendicularly from the surface of IC chip 14. Third plurality of conductive pillars 56 can be positioned radially outward from the first and/or second pluralities of conductive pillars 52, 54. Third plurality of conductive pillars 56 can have an angular orientation $\theta_3$ relative to radial centerline axis C, substantially (shown as being parallel with axis Y). The angular orientation ($\theta_3$) of third plurality of conductive pillars 56, e.g., relative to the Y axis or radial centerline axis C, can be greater than the angular orientation ($\theta_2$) of second plurality of conductive pillars 54 relative to the same axis. The varying differences in angular orientation between each plurality of conductive pillars 52, 54, 56, can provide an outward gradient in the angular profile of each plurality of conductive pillars 52, 54, 56 from radial centerline axis C of IC chip 14. Among other things, the change in angular orientation between each plurality of conductive pillars can be predetermined to accommodate mismatches between substrate 20 and IC chip 14 during joining at elevated temperatures. For example, first plurality of conductive pillars 52 can be oriented substantially in parallel with a vertical reference axis, while second plurality of conductive pillars 54 can have an angular orientation of, e.g., approximately ten degrees of displacement from the vertical reference axis. In turn, third plurality of conductive pillars 56 can have an angular orientation of, e.g., approximately twenty degrees of displacement from the same vertical reference axis. In this example, the angular orientation of conductive pillars 52, 54, 56 can increase by an angular orientation difference of, e.g., approximately ten degrees with each successive plurality of conductive pillars. Although three pluralities of conductive pillars are discussed herein by way of example, it is understood that more pluralities of conductive pillars with respective angular orientations, e.g., five, ten, fifteen, or more pluralities of conductive pillars can be provided with corresponding distinct angular orientations relative to a vertical reference axis.

Figure 4:
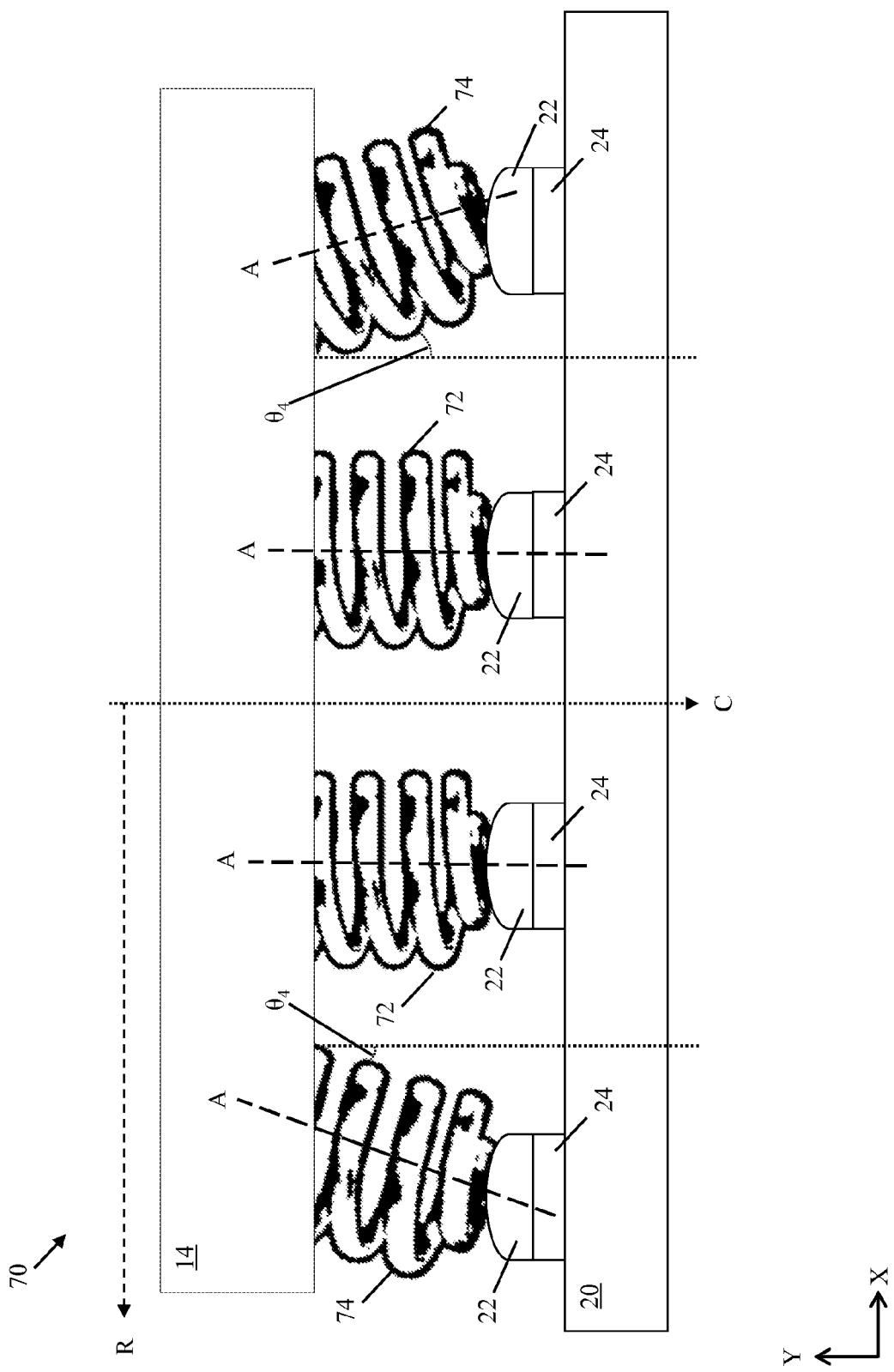
FIG. 4 shows a cross-sectional view in plane X-Y of yet another IC structure according to embodiments of the present disclosure.

Referring now to FIG. 4, a cross-sectional view in plane X-Y of another IC structure 70 according to embodiments of the present disclosure is shown. IC structure 70, as discussed herein, can be embodied as an alternative and/or addition to other IC structures 10, 50 discussed herein. Structure 70 can include, e.g., a first plurality of conductive springs 72 extending substantially perpendicularly from the surface of IC chip 14. In addition, a second plurality of conductive springs 74 can extend substantially non-perpendicularly from the surface of IC chip 14, such that second plurality of conductive springs 74 each have a corresponding angular orientation ($\theta_4$) relative to radial centerline axis C of IC chip 14. Although conductive springs 72, 74 can be helical in shape, their angular orientation can be measured using a centerline axis A of each individual spring. Second plurality of conductive springs 74 can be positioned radially outward from first plurality of conductive springs 72, relative to radial centerline axis C. In addition, second plurality of conductive springs 74 can be oriented radially outward direction from the radial center of IC chip 14 (i.e., radially outward from centerline axis C and first plurality of conductive springs 70). Solder bumps 22 can electrically connect one of several solder bump pads 24 formed on substrate 20 to first or second plurality of conductive springs 72, 74, formed on IC chip 14. First and second pluralities of conductive springs 72, 74, can be formed on and electrically connected to IC chip 14, e.g., by the use of one or more laser sintering processes described elsewhere herein.

Figure 5:
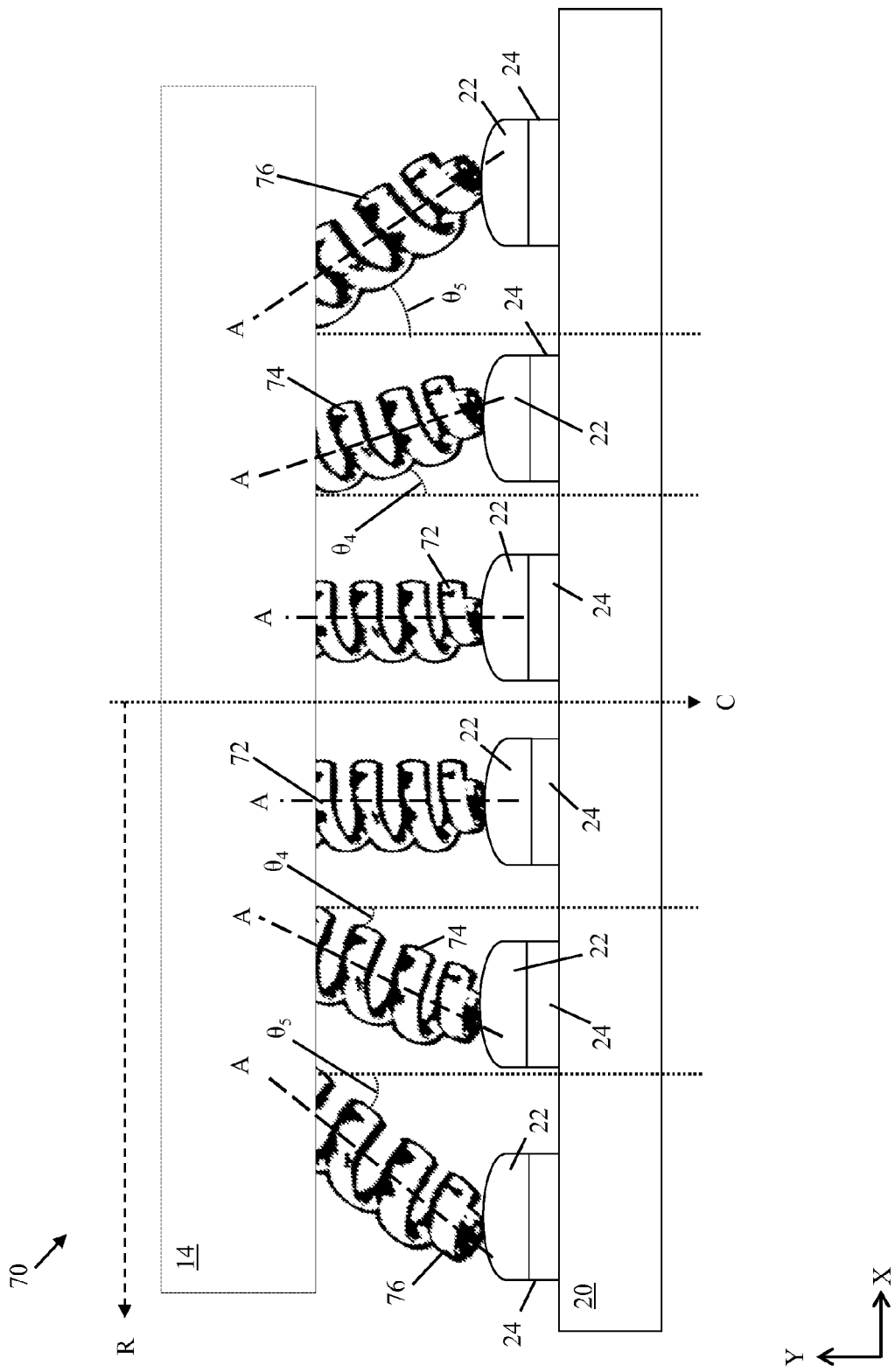
FIG. 5 shows a cross-sectional view in plane X-Y of an additional IC structure according to embodiments of the present disclosure.

Turning to FIG. 5, IC structure 70 can also include a third plurality of conductive springs 76 extending substantially non-perpendicularly from the surface of IC chip 14. Third plurality of conductive springs 76, in turn, can be positioned radially outward from the first and/or second pluralities of conductive springs 72, 74. Third plurality of conductive springs 76 can have an angular orientation $\theta_5$ relative to radial centerline axis C (oriented substantially in parallel with the Y axis). The angular orientation ($\theta_5$) of third plurality of conductive springs 76, e.g., relative to the Y axis or centerline axis C, can be greater than the angular orientation ($\theta_4$) of the second plurality of conductive springs 74, relative to the same axis. The differences in angular orientation between each plurality of conductive springs 72, 74, 76 can provide an angular gradient in the direction of X axis from radial centerline axis C. More specifically, the angular orientation of each plurality of conductive springs 72, 74, 76 relative to radial centerline axis C can increase proportionately with a distance from radial centerline axis C of IC chip 14. Among other things, the profiled change in angular orientation between each plurality of springs 72, 74, 76 can be predetermined to accommodate mismatches between substrate 20 and IC chip 14 at elevated temperatures when the two components are joined. For example, first plurality of conductive springs 72 can be oriented substantially in parallel with radial centerline axis C where there is little to no risk of mismatch, while second and third pluralities of conductive springs 74, 76 can consecutively increase in angular orientation by, e.g., approximately ten degrees of displacement from the adjacent plurality of conductive springs (e.g., first or second plurality of conductive springs 72, 74). Although three pluralities of conductive springs 72, 74, 76 are discussed herein by way of example, it is understood that more pluralities of conductive springs with respective angular orientations, e.g., five, ten, fifteen, or more pluralities of conductive springs can be provided with corresponding distinct angular orientations relative to a vertical reference axis. It is also understood that embodiments of IC structure 70 can be applied as an addition or alternative to IC structure(s) 10, 50 described elsewhere herein, or can be combined with IC structure(s) 10, 50 where desired.

Embodiments of the present disclosure can provide multiple technical and commercial advantages, some of which are discussed by way of example herein. Embodiments of each IC structure described herein, when fabricated using a combination of selective laser sintering, can reduce stress and extend fatigue life of IC chip-to-packaging components joined at elevated temperatures. Whether the IC structure is embodied to include conductive pillars or springs, the use of one or more angled elements can also reduce strain which could otherwise be induced against the interconnect components after the joined structure returns to room temperature. Furthermore, the various conductive interconnect elements discussed herein can be oriented to extend radially outward from a radial centerline axis of an IC chip, such that stress/strain relief is provided in the same direction as thermal expansion of a wafer and/or substrate when the components are joined together.

The resulting IC structures described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. An integrated circuit (IC) structure comprising:
   an IC chip interconnect surface including a radially inner region positioned within a radially outer region;
   a first plurality of conductive pillars extending outward from the radially inner region of the IC chip interconnect surface, relative to a radial centerline axis of the radially inner region of the IC chip interconnect surface, wherein each of the first plurality of conductive pillars includes a solder bump contacting a longitudinally distal end of the first conductive pillar, relative to the IC chip interconnect surface, wherein each of the first plurality of conductive pillars includes a laser-sintered metal;
   a second plurality of conductive pillars extending substantially non-perpendicularly from the interconnect surface of the IC chip, wherein each of the second plurality of conductive pillars is positioned radially outward from the first plurality of conductive pillars, relative to the radial centerline axis; and
   a third plurality of conductive pillars extending substantially non-perpendicularly from the interconnect surface of the IC chip, wherein each of the third plurality of conductive pillars is positioned radially outward from the second plurality of conductive pillars,
   wherein an angular orientation of the second plurality of conductive pillars relative to the radial centerline axis and the third plurality of conductive pillars relative to the radial centerline axis increases by an angular orientation difference for each successive plurality of the conductive pillars in a direction from the radially inner region toward the radially outer region, and
   wherein the radially inner region of the IC chip interconnect surface is free of conductive pillars thereon.

2. The IC structure of claim 1, further comprising a plurality of solder bump pads each positioned on a substrate and electrically connected to a respective one of the plurality of solder bumps, wherein the substrate includes one of a printed circuit board and a laminate.

3. An integrated circuit (IC) structure comprising:
   an IC chip having an interconnect surface thereon;
   a first plurality of conductive springs extending substantially perpendicularly from the interconnect surface of the IC chip;
   a second plurality of conductive springs extending substantially non-perpendicularly from the interconnect surface of the IC chip, wherein each of the second plurality of conductive springs is positioned radially outward from the first plurality of conductive springs, relative to a radial centerline axis of the IC chip; and
   a third plurality of conductive springs extending substantially non-perpendicularly from the interconnect surface of the IC chip, wherein each of the third plurality of conductive springs is positioned radially outward from the second plurality of conductive springs,
   wherein an angular displacement of each of the third plurality of conductive springs relative to the radial centerline axis is greater than an angular displacement of each of the second plurality of conductive springs relative to the radial centerline axis, and
   wherein an angular orientation of each of the first plurality of conductive springs, the second plurality of conductive springs and the third plurality of conductive springs increases proportionately with a distance from the radial centerline axis in a direction away from the radial centerline axis of the IC chip.

4. The IC structure of claim 1, wherein the angular orientation of the first plurality of conductive pillars, the second plurality of conductive pillars and the third plurality of conductive pillars consecutively increases from the radially inner region to the radially outer region.

5. An integrated circuit (IC) structure comprising:
   an IC chip having an interconnect surface thereon;

a first plurality of conductive pillars extending substantially perpendicularly from the interconnect surface of the IC chip;

a second plurality of conductive pillars extending substantially non-perpendicularly from the interconnect surface of the IC chip, wherein each of the second plurality of conductive pillars is positioned radially outward from the first plurality of conductive pillars, relative to a radial centerline axis of the IC chip;

a third plurality of conductive pillars extending substantially non-perpendicularly from the interconnect surface of the IC chip, wherein each of the third plurality of conductive pillars is positioned radially outward from the second plurality of conductive pillars, relative to the radial centerline axis of the IC chip; and a plurality of solder bumps, each of the plurality of solder bumps contacting one of the first second and third pluralities of conductive pillars at a distal end, relative to the interconnect surface of the IC chip, wherein an angular orientation of each of the third plurality of conductive pillars relative to the radial centerline axis is different from an angular orientation of each of the second plurality of conductive pillars relative to the radial centerline axis, and wherein the angular orientation of the second plurality of conductive pillars relative to the radial centerline axis and the third plurality of conductive pillars relative to the radial centerline axis increases by an angular orientation difference for each successive plurality the conductive pillars in a direction away from the radial centerline axis of the IC chip.

6. The IC structure of claim 5, further comprising:
a plurality of solder bump pads each positioned on a substrate and electrically connected to a respective one of the plurality of solder bumps, wherein the substrate includes one of a printed circuit board and a laminate.

7. The IC structure of claim 5, wherein each of the second plurality of conductive pillars includes a proximal end contacting the interconnect surface of the IC chip and a distal end, the distal end having a greater distance from the radial centerline axis than the proximal end.

8. The IC structure of claim 5, wherein each conductive pillar of the first and second pluralities of conductive pillars includes a laser-sintered metal.

9. The IC structure of claim 5, wherein the angular orientation of the first plurality of conductive pillars, the second plurality of conductive pillars and the third plurality of conductive pillars consecutively increases as a distance increases from the radial centerline axis of the IC chip.

10. The IC structure of claim 3, wherein each conductive spring of the first and second pluralities of conductive springs includes a laser-sintered metal.

11. The IC structure of claim 3, wherein each of the plurality of conductive springs includes a solder bump formed between a distal end thereof and a solder bump pad positioned on a substrate, wherein the substrate includes one of a printed circuit board and a laminate.

12. The IC structure of claim 3, wherein each of the second plurality of conductive springs includes a proximal end contacting the interconnect surface of the IC chip and a distal end, the distal end having a greater distance from the radial centerline axis than the proximal end.

13. The IC structure of claim 3, wherein the angular orientation of the first plurality of conductive springs, the second plurality of conductive springs and the third plurality of conductive springs consecutively increases as a distance increases from the radial centerline axis of the IC chip.

14. The IC structure of claim 13, further comprising:
additional pluralities of conductive springs extending substantially non-perpendicularly from the interconnect surface of the IC chip, wherein each of the additional pluralities of conductive springs is positioned radially outward from the third plurality of conductive springs, wherein each additional plurality of conductive springs has a consecutively increasing angular orientation relative to a radially adjacent inner plurality of conductive springs.

* * * * *